United States Patent
Daishoji (10) Patent No.: US 8,390,492 B2
(45) Date of Patent: Mar. 5, 2013

(54) SIGNAL PROCESSING APPARATUS

(75) Inventor: Takeshi Daishoji, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 85 days.

(21) Appl. No.: 13/070,794

(22) Filed: Mar. 24, 2011

(65) Prior Publication Data
US 2011/0234438 A1 Sep. 29, 2011

(30) Foreign Application Priority Data

Mar. 25, 2010 (JP) ................................ 2010-069316

(51) Int. Cl.
 *H03M 1/00* (2006.01)
(52) U.S. Cl. ........ 341/138; 381/102; 376/271; 376/340; 370/315; 370/329; 455/142; 455/207; 455/330; 455/337; 455/209; 330/284; 330/298; 330/302
(58) Field of Classification Search .......... 341/130–160; 381/102; 375/271–340; 370/315, 329; 455/142, 455/188.2, 307, 330, 333, 337, 209, 552.1; 330/284, 298, 302
See application file for complete search history.

(56) References Cited

U.S. PATENT DOCUMENTS

| | | | | |
|---|---|---|---|---|
| 5,821,889 A | * | 10/1998 | Miller | 341/139 |
| 6,417,730 B1 | * | 7/2002 | Segallis et al. | 330/129 |
| 7,272,374 B2 | * | 9/2007 | Tuttle et al. | 455/333 |
| 7,321,324 B2 | * | 1/2008 | Piovaccari | 341/143 |
| 7,471,940 B2 | * | 12/2008 | Tuttle et al. | 455/333 |
| 7,881,692 B2 | * | 2/2011 | Tuttle et al. | 375/334 |
| 7,890,081 B2 | * | 2/2011 | Huyart et al. | 455/337 |
| 8,203,385 B2 | * | 6/2012 | Kasha et al. | 330/284 |
| 2009/0250262 A1 | * | 10/2009 | Jin | 174/384 |

FOREIGN PATENT DOCUMENTS

JP 2003-52096 A 2/2003

* cited by examiner

*Primary Examiner* — Lam T Mai (74) *Attorney, Agent, or Firm* — Crowell & Moring LLP (57) ABSTRACT

A signal processing apparatus includes: a digital processing unit to which a digital input signal is supplied, which performs a digital process on the digital input signal to produce a digital signal, and which produces a control signal designating a specific time period when an amplitude of an analog output signal is to be lowered; a DA-conversion unit which converts the digital signal to produce an analog signal; and a variable gain unit which adjusts an amplitude of the analog signal to produce the analog output signal, and which lowers the amplitude of the analog output signal during the specific time period designated by the control signal.

6 Claims, 8 Drawing Sheets

SIGNAL PROCESSING APPARATUS

BACKGROUND OF THE INVENTION

1. Technical Field

The present invention relates to a signal processing apparatus which performs signal processing on an input signal to produce an output signal, and more particularly to a technique for reducing the noise level.

2. Background Art

As one of techniques for reducing the noise level, there is a noise gate which attenuates a signal during a time period containing only noise components. Noise gates include a digital noise gate in which a digital signal is attenuated in a digital portion to and from which the signal is input and output, and an analog noise gate in which an analog signal is attenuated in an analog portion to and from which the signal is input and output.

With respect to an analog noise gate, there is a technique disclosed in JP-A-2003-52096. JP-A-2003-52096 discloses a noise gate apparatus including: a head amplifier which amplifies an audio signal; a noise gate which blocks the amplified audio signal during a time period when the amplitude value is equal to or lower than a threshold; and a parameter conversion unit which sets the threshold corresponding to the gain (amplification factor) of the head amplifier, in the noise gate.

In a device in which a severe restriction is imposed on power consumption, such as a portable telephone, a configuration is preferably employed in which the amplitude of an audio signal is set as low as possible in front of an amplifier, and largely increased in the amplifier. When this configuration is employed, the digital noise gate cannot reduce noise components which are mixed in a DAC (Digital to Analog Converter) in a stage subsequent to the digital portion and the amplifier. In the analog noise gate, such noise components can be reduced, but it is difficult to specify a time period containing only noise components with high accuracy based on a signal with which such noise components are mixed. Accordingly, the noise level cannot be reduced with sufficiently high accuracy.

SUMMARY OF THE INVENTION

The present invention has been conducted under such circumstances. It is an object of the invention that the noise level is reduced by a noise gate with sufficiently high accuracy.

There is provided a signal processing apparatus including: a digital processing unit to which a digital input signal is supplied, which performs a digital process on the digital input signal to produce a digital signal, and which produces a control signal designating a specific time period when an amplitude of an analog output signal is to be lowered; a DA-conversion unit which converts the digital signal to produce an analog signal; and a variable gain unit which adjusts an amplitude of the analog signal to produce the analog output signal, and which lowers the amplitude of the analog output signal during the specific time period designated by the control signal.

DETAILED DESCRIPTION OF THE EXEMPLARY EMBODIMENTS

An aspect of the invention provides a signal processing apparatus including: a digital processing unit to which a digital input signal is supplied, which performs a digital process on the digital input signal to produce a digital signal, and which produces a control signal designating a specific time period when an amplitude of an analog output signal is to be lowered; a DA-conversion unit which converts the digital signal to produce an analog signal; and a variable gain unit which adjusts an amplitude of the analog signal to produce the analog output signal, and which lowers the amplitude of the analog output signal during the specific time period designated by the control signal.

According to the aspect of the invention, the digital processing unit produces a digital signal from a digital input signal, the DA-conversion unit produces an analog signal from the digital signal, and the variable gain unit produces an analog output signal from the analog signal. In addition, the digital processing unit designates the specific time period when the amplitude of the analog output signal is to be lowered, and the variable gain unit lowers the amplitude of the analog output signal during the specific time period. Namely, the variable gain unit functions as a noise gate which attenuates the signal during the specific time period. The digital input signal which has not been mixed with noises that are generated in the DA-conversion unit and the variable gain unit is supplied to the digital processing unit. Therefore, the digital processing unit can specify a noise time period with sufficiently high accuracy, and designate the specified time period as the specific time period. According to the aspect of the invention, consequently, the noise level is reduced by a noise gate with sufficiently high accuracy.

The signal processing apparatus may be configured so that the digital processing unit senses that the amplitude of the digital input signal is equal to or lower than a predetermined level to activate the control signal. Otherwise, the signal processing apparatus may be configured so that, when a time period in which the amplitude of the digital input signal is equal to or lower than the predetermined level is continued while exceeding a predetermined time, the digital processing unit activates the control signal. In the latter case, even in the case where voice is interrupted because of the intake of breath or choice of words, for example, when the time of interruption is equal to or shorter than the predetermined time, the control signal is not effective. Therefore, the time interval of changes of the gain of the variable gain unit is averagely prolonged. Consequently, generation of noises due to frequent changes of the gain of the variable gain unit is suppressed.

The signal processing apparatus may be configured so that the specific time period is a time period when the amplitude of the analog output signal is set to zero, and the variable gain unit makes the amplitude of the analog output signal zero during the specific time period designated by the control signal. In this case, noise components can be removed during the specific time period.

The signal processing apparatus may be configured so that the digital processing unit produces the control signal indicating that the amplitude of the analog output signal is stepwise reduced with starting from a timing when the specific time period is started, and that the amplitude of the analog output signal is stepwise increased with starting from a timing when the specific time period is ended, and in accordance with the control signal, the variable gain unit stepwise reduces the amplitude of the analog output signal with starting from the timing when the specific time period is started, and stepwise increases the amplitude of the analog output signal with starting from the timing when the specific time period is ended. In this case, generation of noises due to a rapid change of the gain of the variable gain unit can be suppressed.

(Embodiments)

Figure 1:
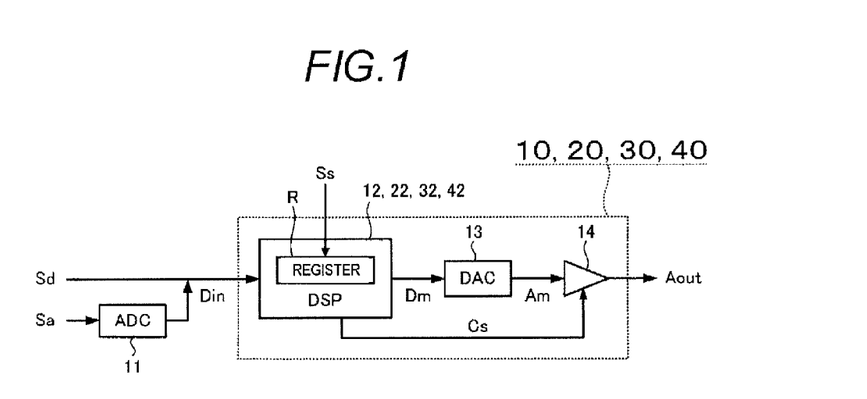
FIG. 1 is a block diagram showing the configurations of signal processing apparatuses 10, 20, 30, and 40 according to first to fourth embodiments of the invention.

Embodiments of the invention will be described with reference to the drawings. FIG. 1 is a block diagram showing the configurations of signal processing apparatuses 10, 20, 30, and 40 according to first to fourth embodiments of the invention. As shown in FIG. 1, the signal processing apparatuses 10, 20, 30, and 40 receive a digital input signal Din, and output an analog output signal Aout. The digital input signal Din corresponds to a signal which is produced by AD-converting an analog signal Sa by an ADC (Analog to Digital Converter) 11, or a digital signal Sd which is supplied from a signal source that produces a digital signal.

Each of the signal processing apparatuses 10, 20, 30, and 40 includes: a DSP (Digital Signal Processor) 12, 22, 32, or 42 which performs a digital process on the digital input signal Din to produce a digital signal Dm, and which functions as a digital processing unit; a DAC 13 which converts the digital signal Dm to produce an analog signal Am, and which functions as a DA-conversion unit; and a variable gain amplifier 14 which adjusts the amplitude of the analog signal Am to produce the analog output signal Aout, and which functions as a variable gain unit. The digital processing unit is not restricted to a DSP, and may be a CPU. The DSP 12, 22, 32, or 42 corresponds to a digital processing unit. Further, the variable gain amplifier 14 corresponds to a variable gain unit.

The DSP includes a register R which holds a set value such as a threshold, and performs the digital process, based on the set value held in the register R and the digital input signal Din. Specifically, the DSP produces a control signal Cs designating a specific time period T when the amplitude of the analog output signal Aout is to be lowered. More specifically, the DSP repeatedly detects the amplitude value (the degree of the amplitude) of the digital input signal Din, senses that an amplitude value which is equal to or lower than the threshold (predetermined level) held in the register R is detected, and activates the control signal Cs.

Also a set signal Ss indicative of the set value is supplied to the DSP. When the set signal Ss is supplied, the DSP writes the set value indicated by the set signal Ss into the register R. The DSP can hold the amplitude value which is previously detected. The DSP outputs the digital input signal Din as it is, as the digital signal Dm. Therefore, the waveform of the digital signal Dm is identical with that of the digital input signal Din.

The variable gain amplifier 14 is an analog amplifier. The variable gain amplifier 14 includes a volume circuit which determines the gain of the amplifier, and performs an amplitude adjustment such as amplification or attenuation so as to obtain the determined gain. The maximum value of the gain is 24 dB, and the minimum value is 0 dB, for instance. However, they are not limited to these values. The gain is determined to be small during part or whole of the specific time period T designated by the control signal Cs, and to be large during the other time period.

As apparent from the above description, when the above-described threshold is adequately determined, the variable gain amplifier 14 can be used as a noise gate. In the embodiments, therefore, the threshold is determined so that the variable gain amplifier 14 functions as a noise gate. Specifically, a value which is smaller than the minimum value of the amplitude value of signal components (non-noise components) that can be contained in the digital input signal Din, and which is equal to or larger than the maximum value of noise components (non-signal components) that can be contained in the digital input signal Din is set as the threshold.

The details of the digital processes performed by the DSPs in the embodiments are different from one another. Therefore, the signal processing apparatuses 10, 20, 30, and 40 include different DSPs, respectively. Specifically, the signal processing apparatus 10 includes the DSP 12, the signal processing apparatus 20 includes the DSP 22, the signal processing apparatus 30 includes the DSP 32, and the signal processing apparatus 40 includes the DSP 42. Hereinafter, the embodiments will be sequentially described.

(First Embodiment)

Figure 2:
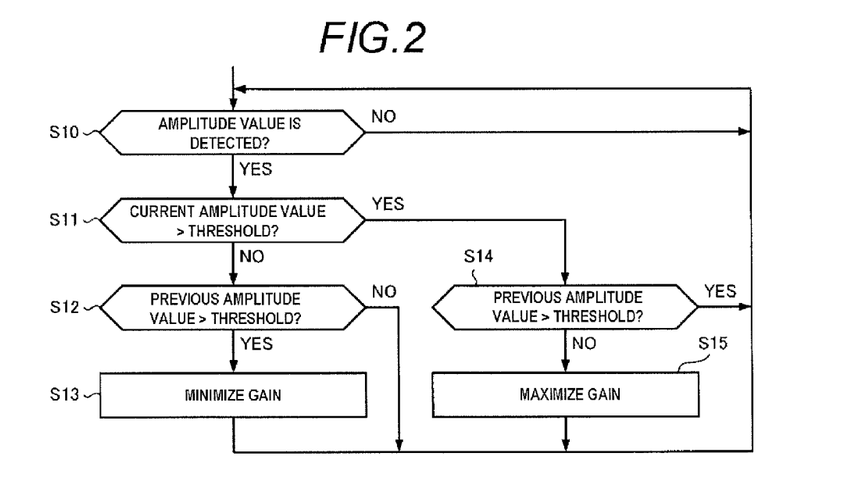
FIG. 2 is a flowchart showing a digital process of a DSP 12 of the signal processing apparatus 10.

FIG. 2 is a flowchart showing the digital process of the DSP 12 in the signal processing apparatus 10 according to the first embodiment. As shown in FIG. 2, the DSP 12 first determines whether the amplitude value is newly detected or not (S10). If the result of the determination indicates NO, the process returns to step S10. If the result of the determination in step S10 indicates YES, the DSP 12 determines whether the currently detected amplitude value is larger than the threshold or not (S11).

If the result of the determination in step S11 indicates NO, the DSP 12 determines whether the previously detected amplitude value is larger than the threshold or not (S12). If the result of the determination indicates NO, the process returns to step S10. If the result of the determination in step S12 indicates YES, the DSP 12 minimizes the gain (S13). Specifically, the gain of the variable gain amplifier 14 is set to the minimum value (0 dB) by activating the control signal Cs. Thereafter, the process returns to step S10.

If the result of the determination in step S11 indicates YES, the DSP 12 determines whether the previously detected amplitude value is larger than the threshold or not (S14). If the result of the determination indicates YES, the process returns to step S10. If the result of the determination in step S14 indicates NO, the DSP 12 maximizes the gain (S15). Specifically, the gain of the variable gain amplifier 14 is set to the maximum value (24 dB) by deactivating the control signal Cs. Thereafter, the process returns to step S10.

Namely, when the amplitude value which is equal to or smaller than the threshold is detected immediately after the amplitude value which is larger than the threshold is detected, the DSP 12 sets the level of the control signal Cs to an effective level at which the gain of the variable gain amplifier 14 is set to the minimum value, and holds the level until an amplitude value which is larger than the threshold is detected. When an amplitude value which is larger than the threshold is detected, the DSP sets the level of the control signal to an ineffective level at which the gain of the variable gain amplifier 14 is set to the maximum value. The specific time period T in the embodiment is a time period when the control signal Cs has the effective level, i.e., a time period when the gain of the variable gain amplifier 14 is set to the minimum value.

Figure 3:
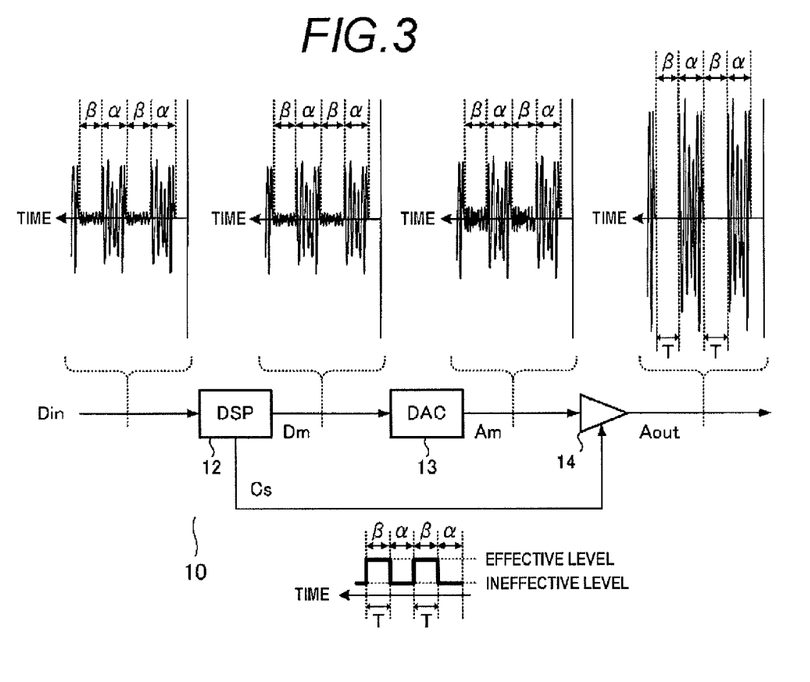
FIG. 3 illustrates the operation of the signal processing apparatus 10.

FIG. 3 illustrates the operation of the signal processing apparatus 10. The waveforms in FIG. 3 are those which are obtained in the case where the signal that is produced by converting the analog signal Sa in FIG. 1 by the ADC 11 is used as the digital input signal Din. As shown in FIG. 3, the digital input signal Din contains signal components during a signal time period α, and does not contain signal components during a non-signal time period β. In the example of FIG. 3, the digital input signal Din contains noise components during all time periods. Actually, a digital signal has a step-like waveform, and the amplitude of the analog output signal Aout is larger than the illustrated amplitude during the time period other than the specific time period T.

As described above, the waveform of the digital signal Dm is identical with that of the digital input signal Din. Therefore, the digital signal Dm contains noise components during the non-signal time period β. The digital signal Dm is converted by the DAC 13, and the analog signal Am is produced. There is a possibility that noises are newly generated in the DAC 13. In the example of FIG. 3, therefore, the amplitude of the analog signal Am during the non-signal time period β is larger than that of the digital signal Dm.

On the other hand, based on the amplitude value of the digital input signal Din and the threshold, the DSP 12 produces the control signal Cs designating the specific time period T. As described above, the threshold is a value which is equal to or larger than the maximum value of the amplitude value of noise components that can be contained in the digital input signal Din, and which is smaller than the minimum value of the amplitude value of signal components that can be contained in the digital input signal Din. Therefore, the control signal Cs is activated at the same time when the non-signal time period β is started, and inactivated at the end of the non-signal time period β. Namely, the non-signal time period β is the specific time period T.

Therefore, the gain of the variable gain amplifier 14 is maintained to the minimum value during the non-signal time period β, and to the maximum value during the other time period. Consequently, the variable gain amplifier 14 attenuates the analog signal Am by the gain which is equal to the minimum value during the non-signal time period β, and amplifies the signal by the gain which is equal to the maximum value during the other time period, thereby producing the analog output signal Aout. As a result, the amplitude of the analog output signal Aout is zero during the non-signal time period β, and sufficiently large during the other time period. This is applicable also to the case where the digital signal Sd is used as the digital input signal Din.

In the signal processing apparatus 10, since the non-signal time period β is the specific time period T, there is a possibility that the time interval of changes of the gain of the variable gain amplifier 14 is very short. In the case where the signal components are configured by voice sound, for example, there is a possibility that a short non-signal time period β which is caused simply by interruption of the voice for the intake of breath or choice of words frequently appears. When such a non-signal time period β is set as the specific time period T, the time interval of changes of the gain of the variable gain amplifier 14 is very short. In this case, noises due to frequent changes of the gain of the variable gain amplifier 14 may be generated. The second embodiment can solve this problem.

In the signal processing apparatus 10, the gain of the variable gain amplifier 14 is uniformly set to the minimum value (0 dB) during the specific time period T, and uniformly set to the maximum value (24 dB) during the other time period. That is, in the boundary of the specific time period T and the other time period, the gain of the variable gain amplifier 14 is rapidly changed, and there is a possibility that noises due to this change are generated. The third embodiment can solve this problem.

(Second Embodiment)

Figure 4:
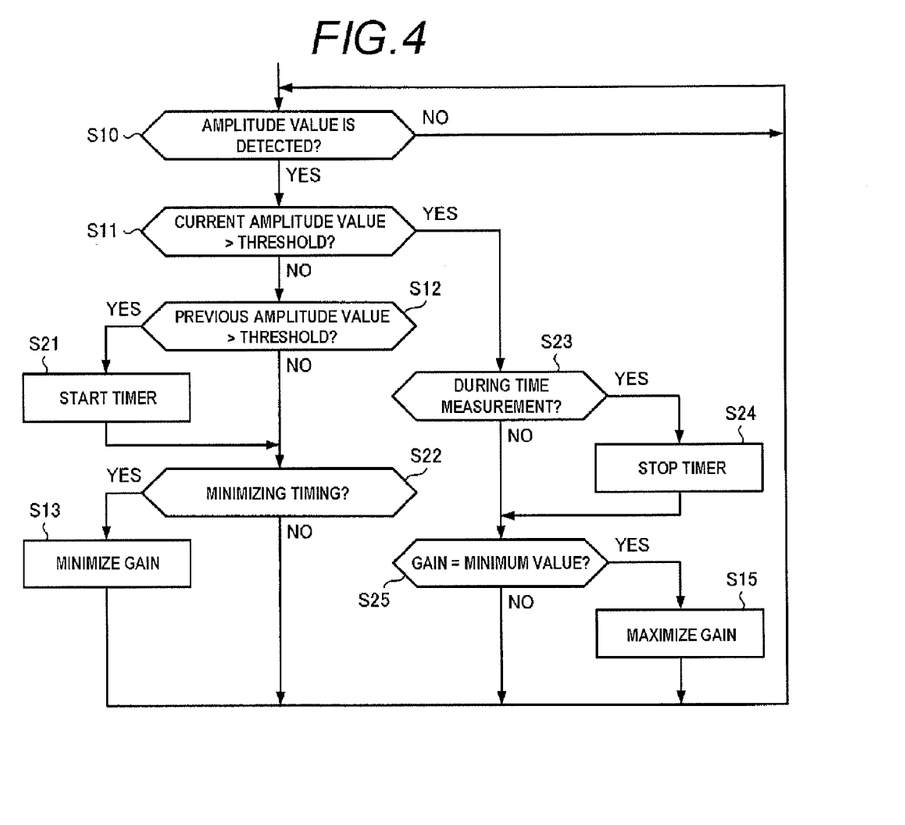
FIG. 4 is a flowchart showing a digital process of a DSP 22 of the signal processing apparatus 20.

FIG. 4 is a flowchart showing a digital process of the DSP 22 in the signal processing apparatus 20 according to the second embodiment. As shown in FIG. 4, similarly with the DSP 12, the DSP 22 determines whether the amplitude value is newly detected or not (S10). If the result of the determination indicates YES, the DSP determines whether the currently detected amplitude value is larger than the threshold or not (S11). If the result of the determination indicates NO, the DSP determines whether the previously detected amplitude value is larger than the threshold or not (S12).

If the result of the determination in step S12 indicates YES, the DSP 22 starts a timer for measuring the elapsed time (S21), and determines whether it is a minimizing timing when the gain of the variable gain amplifier 14 is minimized or not (S22). By contrast, if the result of the determination in step S12 indicates NO, the DSP 22 determines whether it is the minimizing timing or not, without starting the timer for measuring the elapsed time (S22).

The determination whether it is the minimizing timing or not is performed by comparing the elapsed time measured by the timer with a first time γ. If the elapsed time first exceeds the first time γ, the result of the determination indicates YES, and, in the other case, the result indicates NO. The first time γ is a set value which is previously set, and held in the register R of the DSP 22. If the result of the determination in step S22 indicates NO, the process returns to step S10. By contrast, if the result of the determination in step S22 indicates YES, the DSP 22 minimizes the gain (S13). Thereafter, the process returns to step S10.

On the other hand, if the result of the determination in step S11 indicates YES, the DSP 22 determines whether the elapsed time is being measured or not (S23). If the result of the determination indicates YES, the DSP 22 stops the timer for measuring the elapsed time (S24), and determines whether the gain of the variable gain amplifier 14 is the minimum value or not (S25). By contrast, if the result of the determination in step S23 indicates NO, the DSP 22 determines whether the gain of the variable gain amplifier 14 is the minimum value or not, without stopping the timer for measuring the elapsed time (S25).

The result of the determination whether the gain of the variable gain amplifier 14 is the minimum value or not indicates YES in the case where the control signal Cs has the effective level, and NO in the case where the control signal Cs has the ineffective level. If the result of the determination indicates NO, the process returns to step S10. By contrast, if the result of the determination in step S25 indicates YES, the DSP 22 maximizes the gain (S15). Thereafter, the process returns to step S10.

Namely, when the amplitude value which is equal to or smaller than the threshold is continued to be detected during the first time γ, the DSP 22 sets the level of the control signal Cs to the effective level at which the gain of the variable gain amplifier 14 is set to the minimum value, and holds the level until an amplitude value which is larger than the threshold is detected. When an amplitude value which is larger than the threshold is detected, the DSP sets the level of the control signal to an ineffective level at which the gain of the variable gain amplifier 14 is set to the maximum value. The specific time period T in the embodiment is a time period when the control signal Cs has the effective level, i.e., a time period when the gain of the variable gain amplifier 14 is set to the minimum value.

Figure 5:
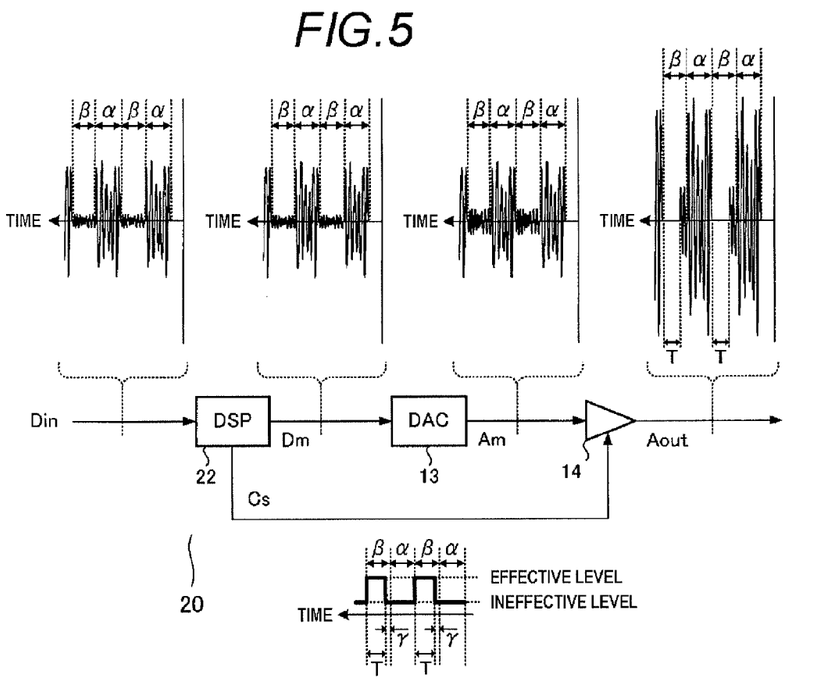
FIG. 5 illustrates the operation of the signal processing apparatus 20.

FIG. 5 illustrates the operation of the signal processing apparatus 20. As shown in FIG. 5, similarly with the DSP 12, based on the amplitude value of the digital input signal Din and the threshold, the DSP 22 produces the control signal Cs designating the specific time period T. In this embodiment, the control signal Cs is activated when the first time γ elapses after the start of the non-signal time period β, and inactivated at the end of the non-signal time period β.

In the signal processing apparatus 20, namely, the specific time period T is the ending time period (β−γ) of the non-signal time period β which is longer than the first time γ. In other words, during the non-signal time period β which is equal to or shorter than the first time γ, the gain of the variable gain amplifier 14 is not changed. Therefore, the time interval of changes of the gain of the variable gain amplifier 14 is averagely prolonged. Consequently, generation of noises due to frequent changes of the gain is suppressed.

(Third Embodiment)

Figure 6:
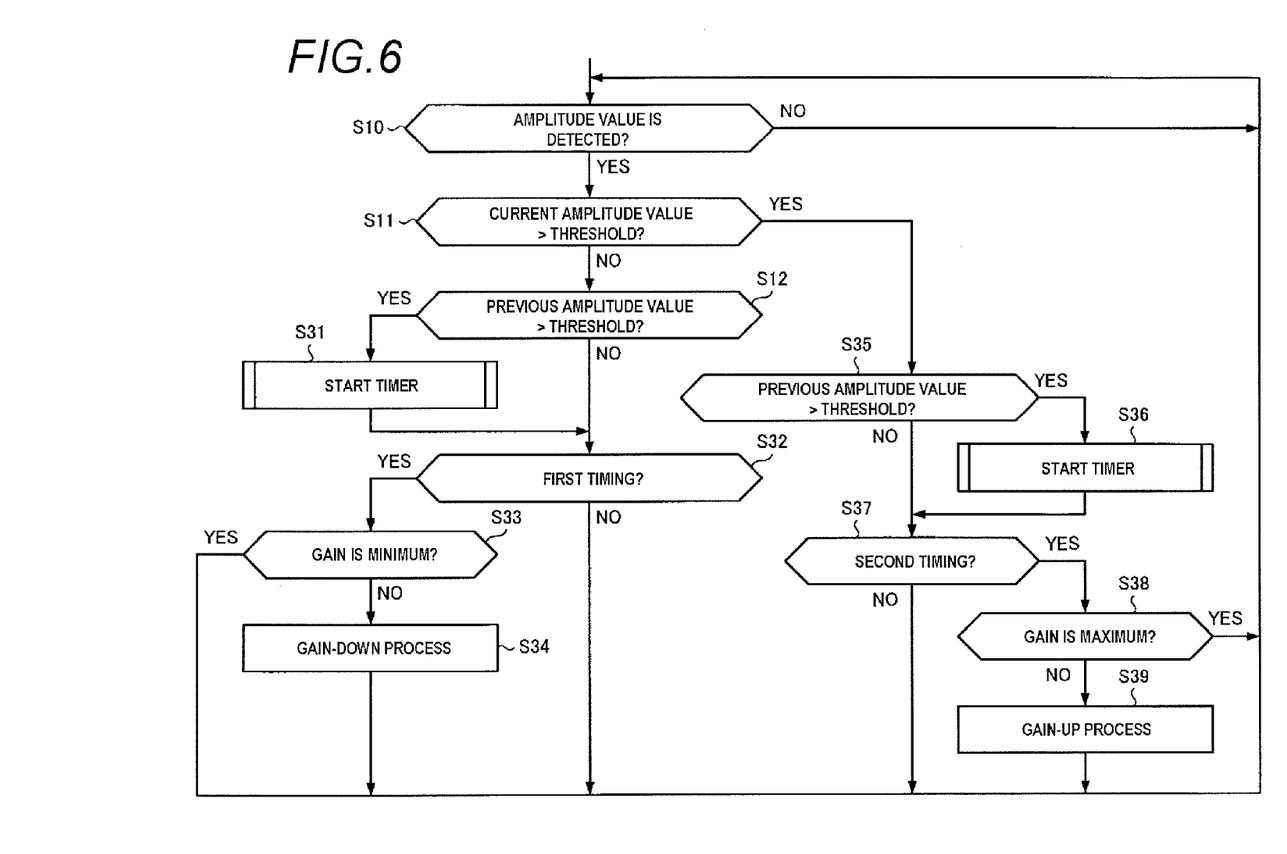
FIG. 6 is a flowchart showing a digital process of a DSP 32 of the signal processing apparatus 30.

FIG. 6 is a flowchart showing a digital process of the DSP 32 in the signal processing apparatus 30 according to the third embodiment. As shown in FIG. 6, similarly with the DSP 12, the DSP 32 determines whether the amplitude value is newly detected or not (S10). If the result of the determination indicates YES, the DSP determines whether the currently detected amplitude value is larger than the threshold or not (S11), and, if the result of the determination indicates NO, the DSP determines whether the previously detected amplitude value is larger than the threshold or not (S12).

If the result of the determination in step S12 indicates YES, the DSP 32 starts the timer for measuring the elapsed time (S31), and determines whether it is a first timing when the gain of the variable gain amplifier 14 is reduced or not (S32). In the process of starting the timer in step S31, there is a possibility that the timer is already started. In this case, the DSP 32 resets the timer value indicating the elapsed time, thereby restarting the timer. By contrast, if the result of the determination in step S12 indicates NO, the DSP 32 determines whether it is the first timing or not, without starting the timer for measuring the elapsed time (S32).

The determination whether it is the first timing or not is performed based on the elapsed time measured by the timer and a predetermined second time δ. If the elapsed time first exceeds a time which is a natural number multiple of the second time δ, the result of the determination indicates YES, and, in the other case, the result indicates NO. The second time δ is a set value which is previously set, and held in the register R of the DSP 32. If the result of the determination in step S32 indicates NO, the process returns to step S10. By contrast, if the result of the determination in step S32 indicates YES, the DSP 32 determines whether the gain of the variable gain amplifier 14 is the minimum value or not (S33).

The result of the determination whether the gain of the variable gain amplifier 14 is the minimum value or not indicates YES in the case where the current level of the control signal Cs is the maximum level, and NO in the other case. If the result of the determination indicates YES, the process returns to step S10. If the result of the determination indicates NO, the DSP 32 performs a gain-down process of reducing the gain of the variable gain amplifier 14 (S34). The gain-down process will be described below in detail.

In the embodiment, as the gain of the variable gain amplifier 14, twenty-five gain levels of 0 dB, 1 dB, . . . , 24 dB are assumed. As the level of the control signal Cs, twenty-five levels (V0, V1, . . . , V24) respectively corresponding to the gain levels are prepared. The relations of V0>V1> . . . >V24 are set. When the level of the control signal Cs is raised by one step (for example, V1→V0), the gain of the variable gain amplifier 14 is reduced by one step (for example, 1 dB→0 dB). When the level of the control signal Cs is raised by one step, the DSP 32 performs the gain-down process. Thereafter, the process returns to step S10.

On the other hand, if the result of the determination in step S11 indicates YES, the DSP 32 determines whether the previously detected amplitude value is larger than the threshold or not (S35). If the result of the determination indicates YES, the DSP 32 starts the timer for measuring the elapsed time in the same manner as step S31 (S36), and determines whether it is a second timing when the gain of the variable gain amplifier 14 is increased or not (S37). By contrast, if the result of the determination in step S35 indicates NO, the DSP 32 determines whether it is the second timing or not, without starting the timer for measuring the elapsed time (S37).

The determination whether it is the second timing or not is performed based on the elapsed time measured by the timer and a predetermined third time ν. If the elapsed time first exceeds a time which is a natural number multiple of the third time ν, the result of the determination indicates YES, and, in the other case, the result indicates NO. The third time ν is a set value which is previously set, and held in the register R of the DSP 32. The second and third times may be set to ν=δ, or ν≠δ.

If the result of the determination in step S37 indicates YES, the process returns to step S10. By contrast, if the result of the determination in step S37 indicates NO, the DSP 32 determines whether the gain of the variable gain amplifier 14 is the maximum value or not (S38). The result of the determination whether the gain of the variable gain amplifier 14 is the maximum value or not indicates YES in the case where the current level of the control signal Cs is the minimum level, and NO in the other case.

If the result of the determination in step S38 indicates YES, the process returns to step S10. By contrast, if the result of the determination in step S38 indicates NO, the DSP 32 performs a gain-up process of increasing the gain of the variable gain amplifier 14 (S39). Specifically, the level of the control signal Cs is lowered by one step. Thereafter, the process returns to step S10.

Figure 7:
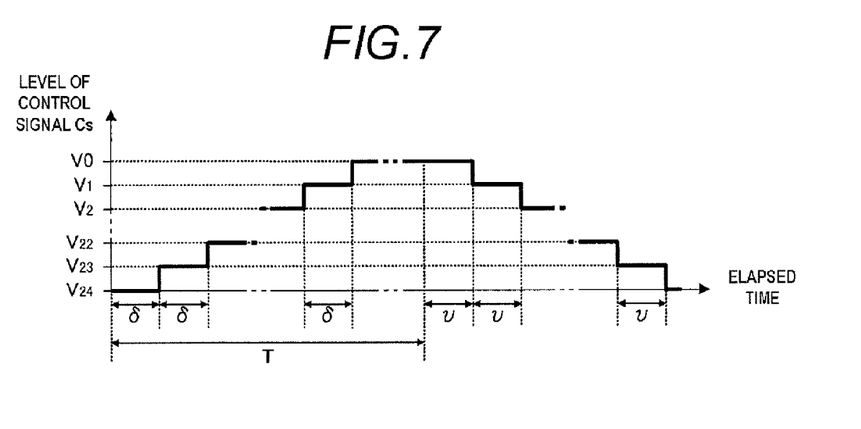
FIG. 7 is a graph showing a level transition example of a control signal Cs which is produced by the DSP 32.

FIG. 7 is a graph showing a level transition example of the control signal Cs which is produced by the DSP 32. As apparent also from FIG. 7, when the amplitude value which is equal to or smaller than the threshold is detected immediately after the amplitude value which is larger than the threshold is detected, the DSP 32 stepwise raises the level of the control signal Cs while setting the maximum level (V0) as the upper limit, and, when the amplitude value which is larger than the threshold is detected, stepwise lowers the level while setting the minimum level (V24) as the lower limit.

As shown in FIG. 7, the specific time period T in the embodiment is started at a timing of starting the process of stepwise raising the level of the control signal Cs, and is ended at a timing of starting the process of stepwise lowering the level of the control signal Cs. Namely, the specific time period T is a time period from the detection of an amplitude value which is equal to or smaller than the threshold immediately after the amplitude value which is larger than the threshold is detected, to that of an amplitude value which is larger than the threshold.

Figure 8:
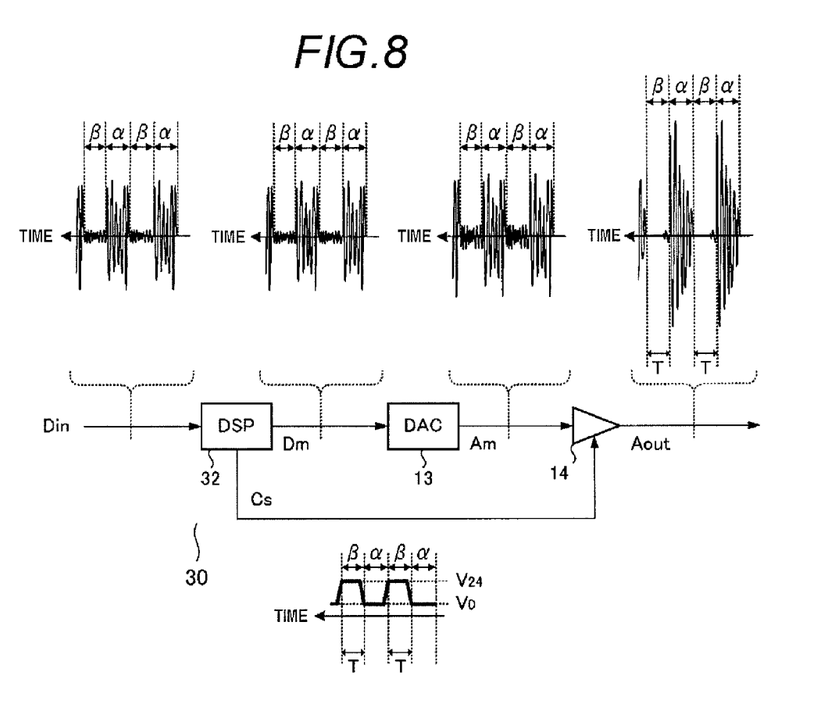
FIG. 8 illustrates the operation of the signal processing apparatus 30.

FIG. 8 illustrates the operation of the signal processing apparatus 30. As shown in FIG. 8, similarly with the DSP 12, based on the amplitude value of the digital input signal Din and the threshold, the DSP 32 produces the control signal Cs designating the specific time period T. Similarly with the signal processing apparatus 10, also, the non-signal time period β corresponds to the specific time period T. As apparent from FIG. 7, however, the control signal Cs which is produced by the DSP 32 is a signal which instructs the gain of the variable gain amplifier 14 to be stepwise reduced with starting from the timing when the specific time period T is started, and to be stepwise increased with starting from the timing when the specific time period T is ended. Therefore, the gain of the variable gain amplifier 14 is stepwise reduced at the timing of starting the non-signal time period β while setting the minimum value as the lower limit, and stepwise increased from the timing of ending the non-signal time period β while setting the maximum value as the upper limit.

As described above, in the signal processing apparatus 30, the gain of the variable gain amplifier 14 is gently changed. Therefore, generation of noises due to a rapid change of the gain of the variable gain amplifier 14 is suppressed.

(Fourth Embodiment)

Figure 9:
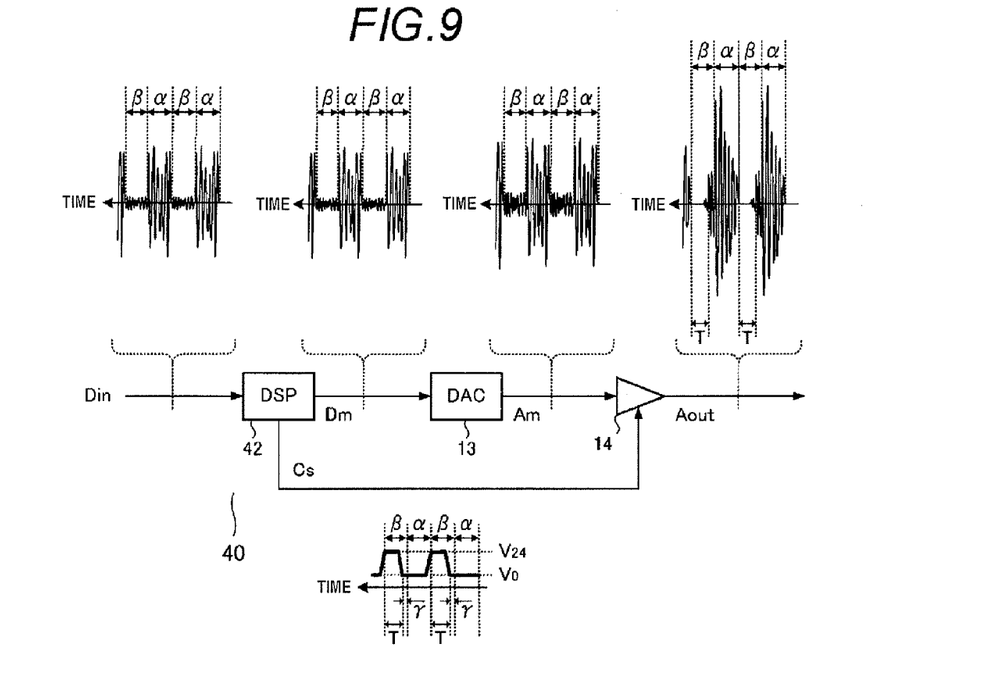
FIG. 9 illustrates the operation of the signal processing apparatus 40.

FIG. 9 illustrates the operation of the signal processing apparatus 40 according to the fourth embodiment. The fourth embodiment is an embodiment in which the second and third embodiments are combined with each other. When the amplitude value which is equal to or smaller than the threshold is continued to be detected during the first time γ, the DSP 42 of the signal processing apparatus 40 stepwise raises the level of the control signal Cs while setting the maximum level (V0) as the upper limit, and, when the amplitude value which is larger than the threshold is detected, stepwise lowers the level of the control signal Cs while setting the minimum level (V24) as the lower limit.

Similarly with the specific time period T in the third embodiment, the specific time period T in the embodiment is started at the timing when the process of stepwise raising the control signal Cs is started, and ended at the timing when the process of stepwise lowering the control signal Cs is started. In contrast that the specific time period T in the third embodiment is started at the timing of starting the non-signal time period β, however, the specific time period T of the fourth embodiment is started when an amplitude value which is equal to or smaller than the threshold is continued to be detected during the first time γ. Similarly with the second embodiment, namely, the specific time period T is the ending time period (β−γ) of the non-signal time period β which is longer than the first time γ.

As apparent from the above description, in the signal processing apparatus 40, the time period which is used as the specific time period T is limited to the ending time period of the non-signal time period β which is longer than the first time γ, and the gain of the variable gain amplifier 14 is gently changed. Therefore, noises due to frequent changes of the gain, and those due to a rapid change of the gain are suppressed from being generated.

(Modifications)

The invention is not limited to the above-described first to fourth embodiments, and also various modes which are obtained by modifying the embodiments, and modes in which arbitrary two or more of the modes are adequately combined with each other are contained in the scope of the invention. For example, modifications of the embodiments are listed as follows.

In the third or fourth embodiment, the time interval of the stepwise changes of the level of the control signal Cs during the specific time period T is constant. The time interval is not limited to this. For example, the time interval may be gradually shortened. Alternatively, in the case where the level of the control signal Cs is stepwise raised, the time interval may be gradually shortened, and, in the case where the level of the control signal Cs is stepwise lowered, the time interval may be gradually prolonged.

In the third or fourth embodiment, either of the stepwise increase of the gain or the stepwise reduction of the gain may be omitted. In the case where the signal components are configured by voice sound, when the amplitude of the initial portion (attack portion) of the signal time period α is low, the voice is hardly heard. From the viewpoint of making the voice to be easily heard, a mode in which the stepwise increase of the gain is omitted is more preferable than that in which the stepwise increase of the gain is performed.

In the embodiments, not only the variable gain amplifier 14, but also the DSP may function as a noise gate. In this case, the waveform of the digital signal Dm is different from that of the digital input signal Din.

In the embodiments, the various set values may be stored in a storage portion other than the register R. The storage portion is placed inside or outside the signal processing apparatus.

In the embodiments, the timing when the level of the control signal Cs transits may be determined with considering the process delay in the DAC 13.

What is claimed is:

1. A signal processing apparatus comprising:
   a digital processing unit to which a digital input signal is supplied, which performs a digital process on the digital input signal to produce a digital signal, and which produces a control signal designating a specific time period when an amplitude of an analog output signal is to be lowered;
   a DA conversion unit which converts the digital signal to produce an analog signal; and
   a variable gain unit which adjusts an amplitude of the analog signal to produce the analog output signal, and which lowers the amplitude of the analog output signal during the specific time period designated by the control signal, wherein
   the digital processing unit senses that the amplitude of the digital input signal is equal to or lower than a predetermined level to activate the control signal.

2. The signal processing apparatus according to claim 1, wherein,
   when a time period in which the amplitude of the digital input signal is equal to or lower than the predetermined level is continued while exceeding a predetermined time, the digital processing unit activates the control signal.

3. The signal processing apparatus according to claim 1, wherein
   the specific time period is a time period when the amplitude of the analog output signal is set to zero, and
   the variable gain unit makes the amplitude of the analog output signal zero during the specific time period designated by the control signal.

4. The signal processing apparatus according to claim 1, wherein
   the digital processing unit produces the control signal indicating that the amplitude of the analog output signal is stepwise reduced with starting from a timing when the specific time period is started, and that the amplitude of the analog output signal is stepwise increased with starting from a timing when the specific time period is ended, and
   in accordance with the control signal, the variable gain unit stepwise reduces the amplitude of the analog output signal with starting from the timing when the specific time period is started, and stepwise increases the amplitude of the analog output signal with starting from the timing when the specific time period is ended.

5. A signal processing apparatus comprising:
a digital processing unit to which a digital input signal is supplied, which performs a digital process on the digital input signal to produce a digital signal, and which produces a control signal designating a specific time period when an amplitude of an analog output signal is to be lowered;
a DA conversion unit which converts the digital signal to produce an analog signal; and
a variable gain unit which adjusts an amplitude of the analog signal to produce the analog output signal, and which lowers the amplitude of the analog output signal during the specific time period designated by the control signal, wherein
the specific time period is a time period when the amplitude of the analog output signal is set to zero, and
the variable gain unit makes the amplitude of the analog output signal zero during the specific time period designated by the control signal.

6. A signal processing apparatus comprising:
a digital processing unit to which a digital input signal is supplied, which performs a digital process on the digital input signal to produce a digital signal, and which produces a control signal designating a specific time period when an amplitude of an analog output signal is to be lowered;
a DA conversion unit which converts the digital signal to produce an analog signal; and
a variable gain unit which adjusts an amplitude of the analog signal to produce the analog output signal, and which lowers the amplitude of the analog output signal during the specific time period designated by the control signal, wherein
the digital processing unit produces the control signal indicating that the amplitude of the analog output signal is stepwise reduced with starting from a timing when the specific time period is started, and that the amplitude of the analog output signal is stepwise increased with starting from a timing when the specific time period is ended, and
in accordance with the control signal, the variable gain unit stepwise reduces the amplitude of the analog output signal with starting from the timing when the specific time period is started, and stepwise increases the amplitude of the analog output signal with starting from the timing when the specific time period is ended.

* * * * *